(12) United States Patent
Chan et al.

(10) Patent No.: US 7,245,509 B1
(45) Date of Patent: Jul. 17, 2007

(54) HALF BRIDGE DRIVER

(75) Inventors: Chun-Kong Chan, Hsi Chih (TW);
Jeng-Shong Wang, Taipei County (TW)

(73) Assignee: Lien Chang Electronic Enterprise Co., Ltd., Taipei County (TW)

( * ) Notice: Subject to any disclaimer, the term of this patent is extended or adjusted under 35 U.S.C. 154(b) by 0 days.

(21) Appl. No.: 11/650,523

(22) Filed: Jan. 8, 2007

(30) Foreign Application Priority Data

Dec. 1, 2006 (TW) .............................. 95144824 A

(51) Int. Cl.
*H02M 3/335* (2006.01)

(52) U.S. Cl. ....................................................... 363/17

(58) Field of Classification Search .................. 363/17, 363/132, 16
See application file for complete search history.

(56) References Cited

U.S. PATENT DOCUMENTS 5,359,274 A * 10/1994 Bandel ....................... 323/207

* cited by examiner

*Primary Examiner*—Shawn Riley
(74) *Attorney, Agent, or Firm*—Rosenberg, Klein & Lee

(57) ABSTRACT

A half bridge driver includes a push/pull control chip outputting a first control signal and a second control signal. Each duty cycle of the two control signals is smaller than 50%. A driver couples to the push/pull control chip and a DC power for receiving the first control signal and the second control signal. A half bridge switch assembly with two N-MOSes couples to the DC power, the driver and a transformer, and converts the DC power into an AC power by the driver. The AC power is transmitted to a first side of the transformer.

7 Claims, 6 Drawing Sheets

HALF BRIDGE DRIVER

BACKGROUND OF THE INVENTION

1. Field of the Invention

The present invention relates to a half bridge driver and, more particularly, to a half bridge driver controlled by a push/pull control chip to drive a load.

2. Description of Related Art

The power supply for a backlight source of a TFT LCD panel makes use of a driver circuit to convert energy and turn a cold cathode fluorescent lamp (CCFL) on. Conventional driver circuits can be divided into half bridge-types, full-bridge types and push/pull-types according to different circuit topologies. A driver circuit is a circuit for converting DC power into AC power.

As shown in FIG. 1, a transformer T1 divides the circuit into a front-end circuit on the first side 101 and a rear-end circuit on the second side 102. The front-end circuit on the first side 101 comprises a DC voltage source Vcc, a first switch Q1, and a second switch Q2. The rear-end circuit on the second side 102 comprises at least one capacitor (C1, C2, C3), a load, and at least one diode (D1, D2). A push/pull control chip 103 is connected between the front-end circuit on the first side 101 and the rear-end circuit on the second side 102.

Reference is made to FIG. 2 as well as FIG. 1. The push/pull control chip 103 outputs a first control signal a and a second control signal b to turn the switching actions of the two switches Q1 and Q2 on the first side 101, respectively. A DC power Vcc is used to provide energy, and the transformer T1 raises and converts the voltage of DC power Vcc to the rear-end circuit 102 for driving the load. The output voltage waveform c on the second side of the transformer T1 is the voltage waveform at point C. As shown in FIG. 2, the output voltage waveform c on the second side is an AC voltage waveform.

In the above description, the push/pull control chip 103 can be an LX1686, an LX1688 or an LX1691 push/pull control chip produced by Linfinity (Microsemi) Corporation, the 02-9RR, 0Z9930, 0Z9938 or 0Z9939 push/pull control chip produced by O2 Micro International Limited, the TL-494 or TL594 push/pull control chip produced by TEXAS INSTRUMENT, or the BIT3193, BIT3713, BIT3715 or BIT3501 push/pull control chip produced by Beyond Innovation Technology.

As shown in FIG. 3, a transformer T2 divides the circuit into a front-end circuit on the first side 201 and a rear-end circuit on the second side 202. The front-end circuit on the first side 201 comprises a DC voltage source Vcc, two electronic switches (Q1, Q2), a half-bridge control chip TL494, two capacitors (C1, C2) and a drive transformer Tr. The rear-end circuit on the second side 202 comprises a load.

Reference is also made to FIG. 4 as well as FIG. 3. The half-bridge control chip TL494 outputs control signals D1-D2 via two output terminals D1 and D2. The control signals D1-D2 control switching actions of the two electronic switches Q1 and Q2 via the drive transformer Tr, respectively. The two electronic switches Q1 and Q2 are N-MOSes or P-MOSes. Through the switching actions of the two electronic switches Q1 and Q2, electric energy stored in the capacitors C1 and C2 can be transferred to a first side terminal T21 of the transformer T2 via a coupled capacitor C3 to form an AC power ac. The voltage of the capacitors C1 and C2 is a half (Vcc/2) of the DC voltage Vcc. The AC power ac is used to provide energy for the transformer T2, which boosts the AC power to the second side 202 for driving the load.

In the above description, if the driver circuit used is the half bridge-type, a half-bridge control chip needs to be matched for normal operations, while if the used driver circuit is of a push/pull-type, a push/pull control chip needs to be matched for normal operations, hence in practical use there is less flexibility and commonality. Because of the above limitation, control chips can't be jointly used and purchased together, or a more complicated circuit needs to be matched.

SUMMARY OF THE INVENTION

Accordingly, an object of the present invention is to provide a half bridge driver, in which a driver is connected between output terminals of a push/pull control chip and a half bridge switch assembly composed of two N-MOSes. The driver is controlled by the push/pull control chip to drive the switching actions of the half bridge switch assembly.

Another object of the present invention is to provide a half bridge driver, in which a driver is connected between two electronic switches and a control chip of the conventional half bridge driver. The control chip is replaced with a push/pull control chip so as to control the switching actions of the two electronic switches separately.

The half bridge driver of the present invention comprises a driver and a half bridge switch assembly, wherein the driver comprises a first light-coupled switch; a first NPN transformer having a collector coupled to the first terminal of a first light-coupled switch and a base coupled to the second terminal of a first light-coupled switch; a first PNP transformer having a base and an emitter coupled to the base and the emitter of a first NPN transformer respectively, and a collector coupled to the first side of a transformer; a first resistor coupled between the base and the collector of a first PNP transformer; a first capacitor coupled between the collector of a first NPN transformer and the collector of a first PNP transformer; a diode having a cathode coupled to the collector of a first NPN transformer and an anode coupled to a control power.

Moreover, the driver further comprises a second light-coupled switch for receiving a second control signal, and having a first output terminal coupled to the control power via a second resistor and a second output terminal coupled to a reference terminal; a second PNP transformer having an emitter coupled to the control power and a base coupled to the first output terminal of a second light-coupled switch via a third resistor; a second NPN transformer having a base coupled to the first output terminal of a second light-coupled switch via a fourth resistor and the reference terminal via fifth resistor, and an emitter coupled to the reference terminal and a collector coupled to the collector of a second PNP transformer.

Furthermore, the half bridge switch assembly comprises a first N-MOS having a gate coupled to the emitter of a first PNP transformer and a drain coupled to the DC power and a source coupled to the first side of a transformer; and a second N-MOS having a gate coupled to the collector of a second PNP transformer and a drain coupled to the source of a first N-MOS and a source coupled to the reference terminal.

The half bridge driver of the present invention uses a driver in the conventional half bridge driver to match a push/pull control chip so as to drive the switching actions of the half bridge switch assembly. The present invention has higher flexibility in practical use, and isn't limited by the control chip. Moreover, manufacturers only need to use push/pull control chips to drive and control push/pull driver circuits or half bridge driver circuits.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENTS

Figure 1:
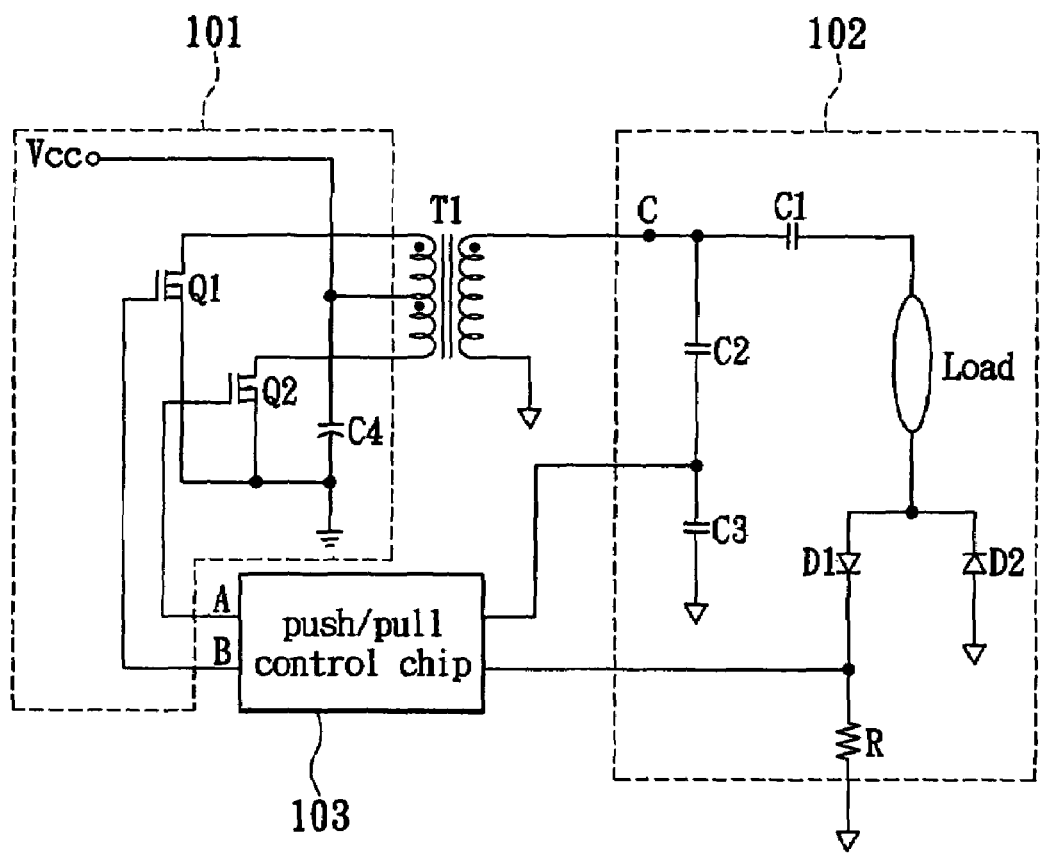
FIG. 1 is a circuit diagram of the push/pull driver circuit that drives a load in the prior art.
Figure 2:
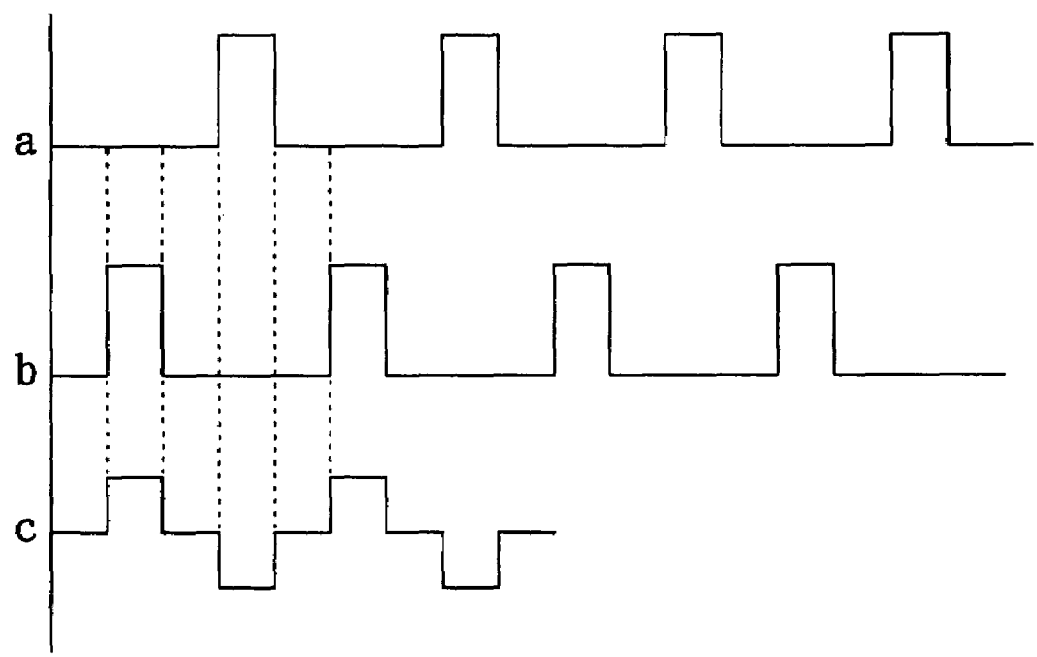
FIG. 2 is a waveform diagram of the control signals outputted by the push/pull control chip and the output voltage at the load in the prior art.
Figure 3:
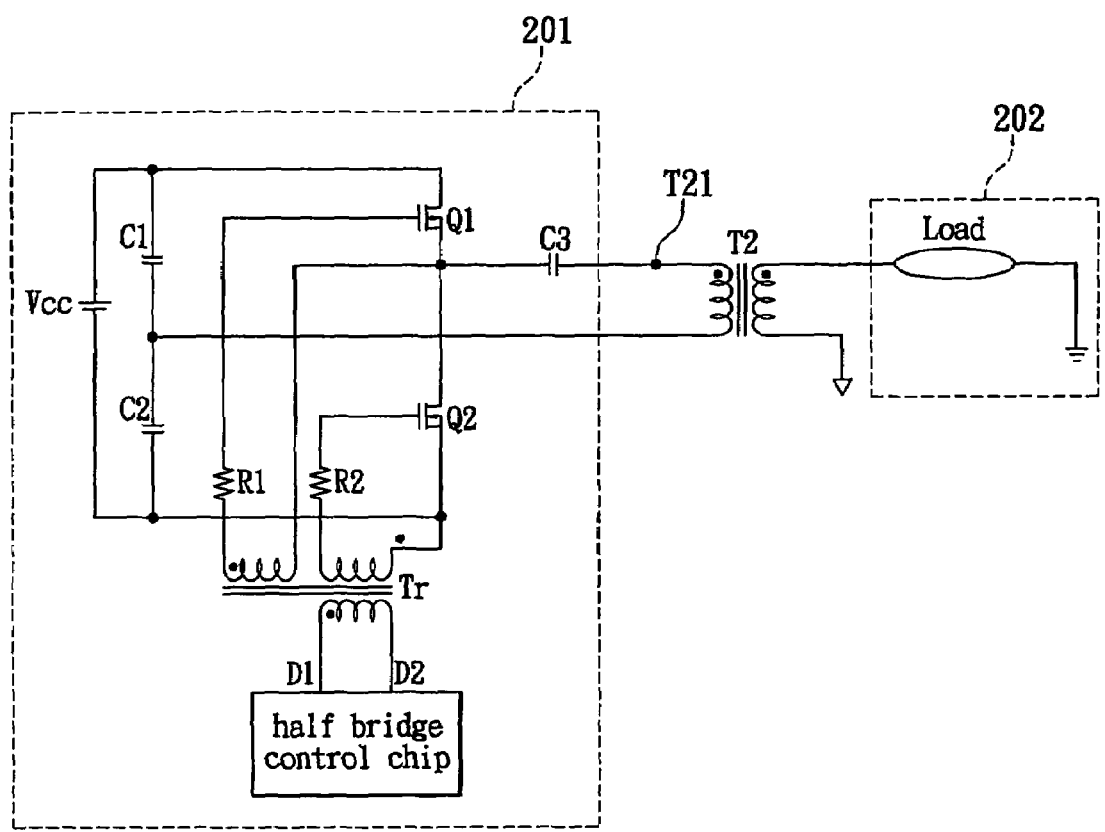
FIG. 3 is a circuit diagram of the half bridge driver circuit that drives a load in the prior art.
Figure 4:
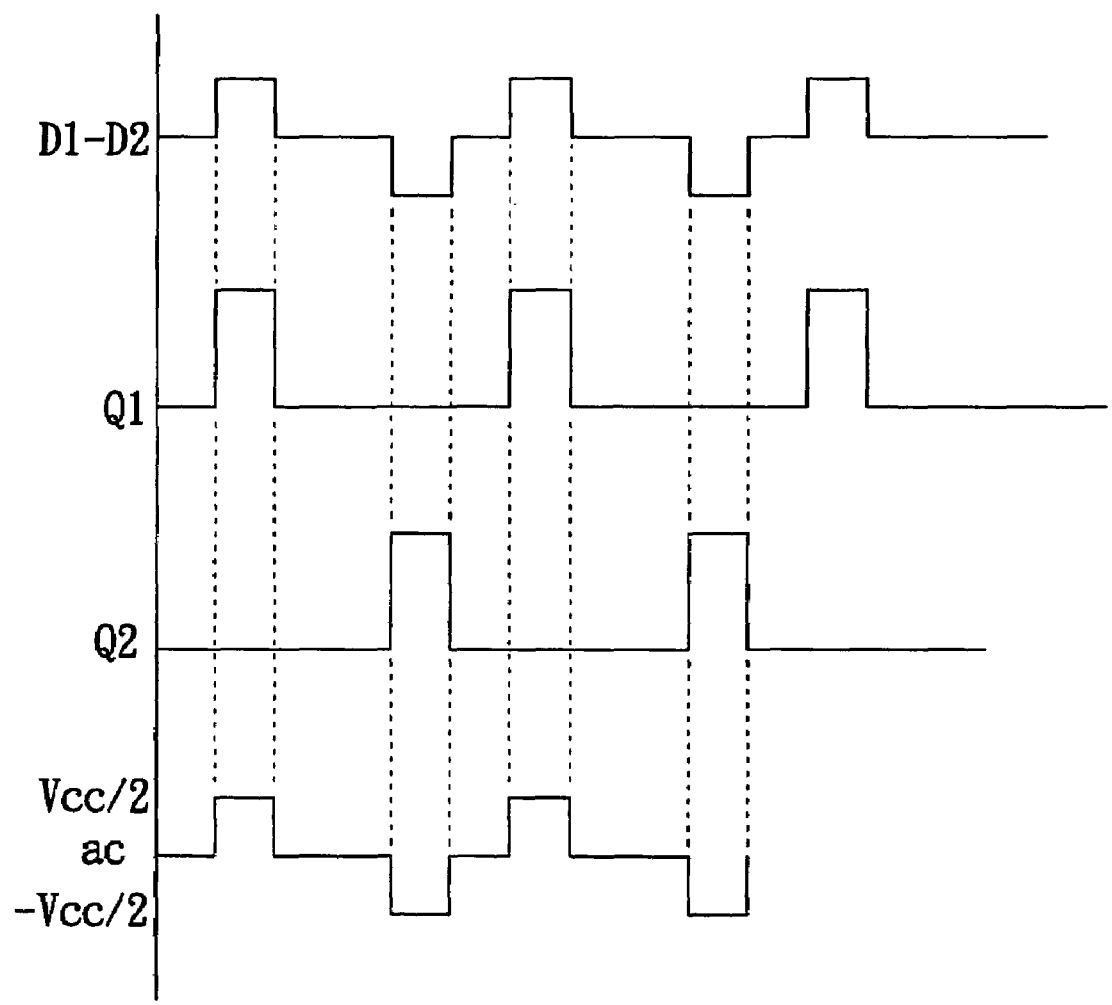
FIG. 4 is a waveform diagram of the control signals outputted by the half bridge control chip and the AC power voltage in the prior art.
Figure 5:
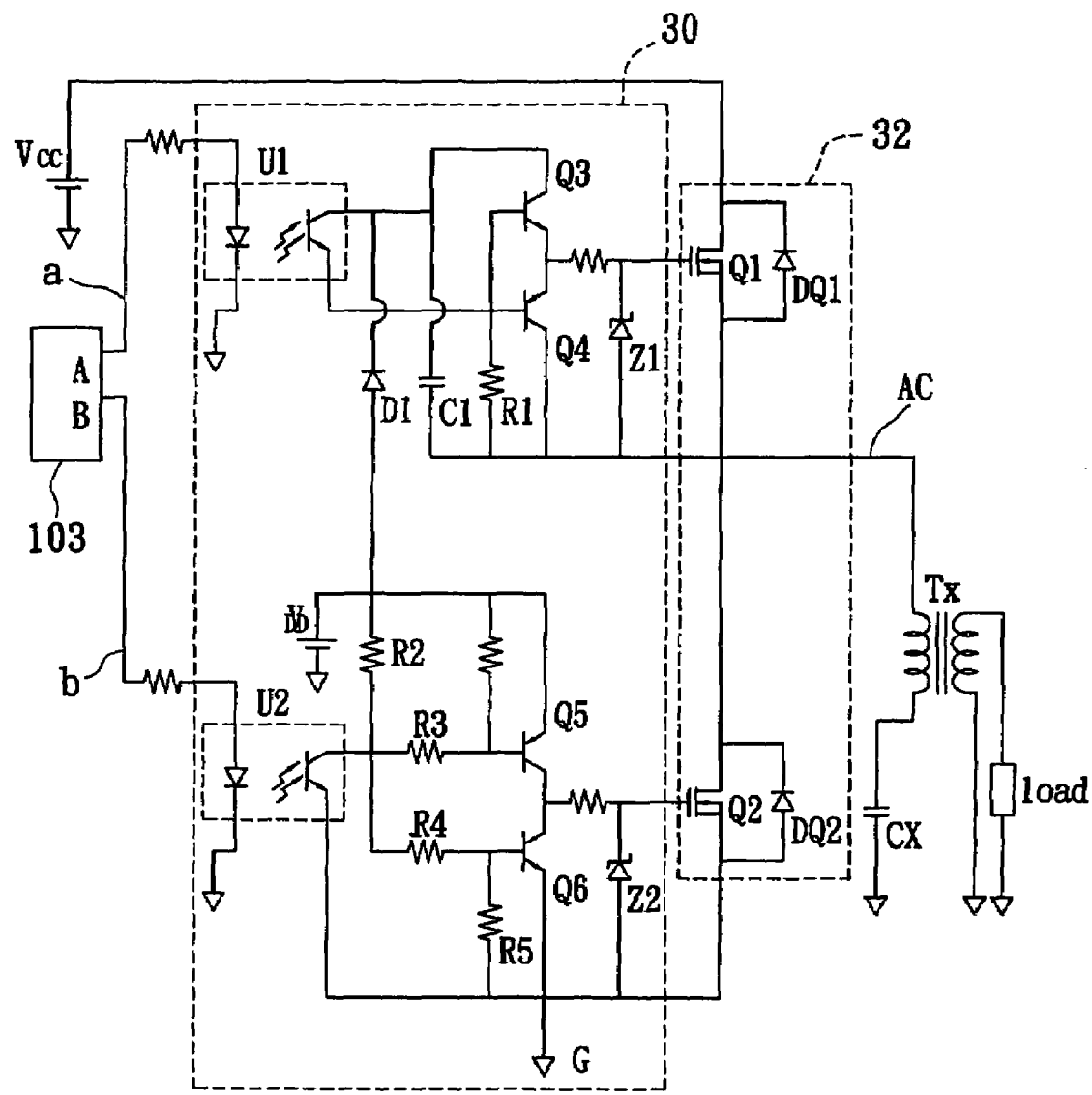
FIG. 5 is a circuit diagram of the half bridge driver with a dual N-MOS according to the first embodiment of the present invention.

As shown in FIG. 5, a half bridge driver according to a first embodiment of the present invention is connected to a first side of a transformer Tx to convert a DC power Vcc to an AC power. The AC power provides electric energy required by the load RL via the transformer Tx.

Reference is made to FIG. 5 again. The half bridge driver according to the first embodiment of the present invention comprises a push/pull control chip 103, a driver 30, and a half bridge switch assembly 32. The push/pull control chip 103 has a first output terminal A and a second output terminal B, wherein the first output terminal A outputs a first control signal a with a duty cycle greater than 50% and the second output terminal B outputs a second control signal b with a duty cycle smaller than 50%. The driver 30 couples to the first output terminal A and the second output terminal B of the push/pull control chip 103 for receiving the first control signal a and the second control signal b. The half bridge switch assembly 32 is composed of two N-MOSes (Q1, Q2). The half bridge switch assembly 32 couples to the DC power Vcc, the driver 30 and the transformer Tx. The half bridge switch assembly 32 is controlled by the driver 30 to convert the DC power Vcc to the AC power. The AC power is transmitted to the first side of the transformer Tx. Furthermore, the first side of a transformer Tx further couples in serial to a resonance capacitor CX.

Reference is made to FIG. 5 again. The driver 30 comprises a first light-coupled switch U1, which is used to receive the first control signal a; a first NPN transformer Q3, which has a collector coupled to the first terminal of a first light-coupled switch U1 and a base coupled to the second terminal of a first light-coupled switch U1; a first PNP transformer Q4, which has a base and an emitter coupled to the base and the emitter of a first NPN transformer Q3 respectively, and a collector coupled to the first side of a transformer Tx; a first resistor R1, which couples between the base and the collector of a first PNP transformer Q4; a first capacitor C1, which couples between the collector of a first NPN transformer Q3, and the collector of a first PNP transformer Q4.

The driver 30 further comprises a diode D1, which has a cathode coupled to the collector of a first NPN transformer Q3 and an anode coupled to a control power VDD; a second light-coupled switch U2, which is used to receive a second control signal b, and has a first output terminal coupled to the control power VDD via a second resistor R2 and a second output terminal coupled to a reference terminal G; a second PNP transformer Q5, which has an emitter coupled to the control power VDD and a base coupled to the first output terminal of a second light-coupled switch U2 via a third resistor R3; a second NPN transformer Q6, which has a base coupled to the first output terminal of a second light-coupled switch U2 via a fourth resistor R4 and the reference terminal G via fifth resistor R5, and an emitter coupled to the reference terminal G and a collector coupled to the collector of a second PNP transformer Q5.

Reference is made to FIG. 5 again. The half bridge switch assembly 32 comprises a first N-MOS Q1 and a second N-MOS Q2. The first N-MOS Q1 has a gate coupled to the emitter of a first PNP transformer Q4 and a drain coupled to the DC power VCC and a source coupled to the first side of a transformer Tx. The second N-MOS Q2 has a gate coupled to the collector of a second PNP transformer Q5 and a drain coupled to the source of a first N-MOS Q1 and a source coupled to the reference terminal G. Furthermore, the half bridge switch assembly 32 further comprises a first zener diode Z1 coupled between the gate and the source of a first N-MOS Q1, and a second zener diode Z2 coupled between the gate and the source of a second N-MOS Q2.

Reference is made to FIG. 5 again. The DC power Vcc provides a positive DC power +Vcc for the transformer Tx through conduction of the first N-MOS Q1 to form a positive half-cycle of driving, or provides a negative DC power −Vcc for the transformer Tx through conduction of the second N-MOS Q2 to form a negative half-cycle of driving.

Figure 6:
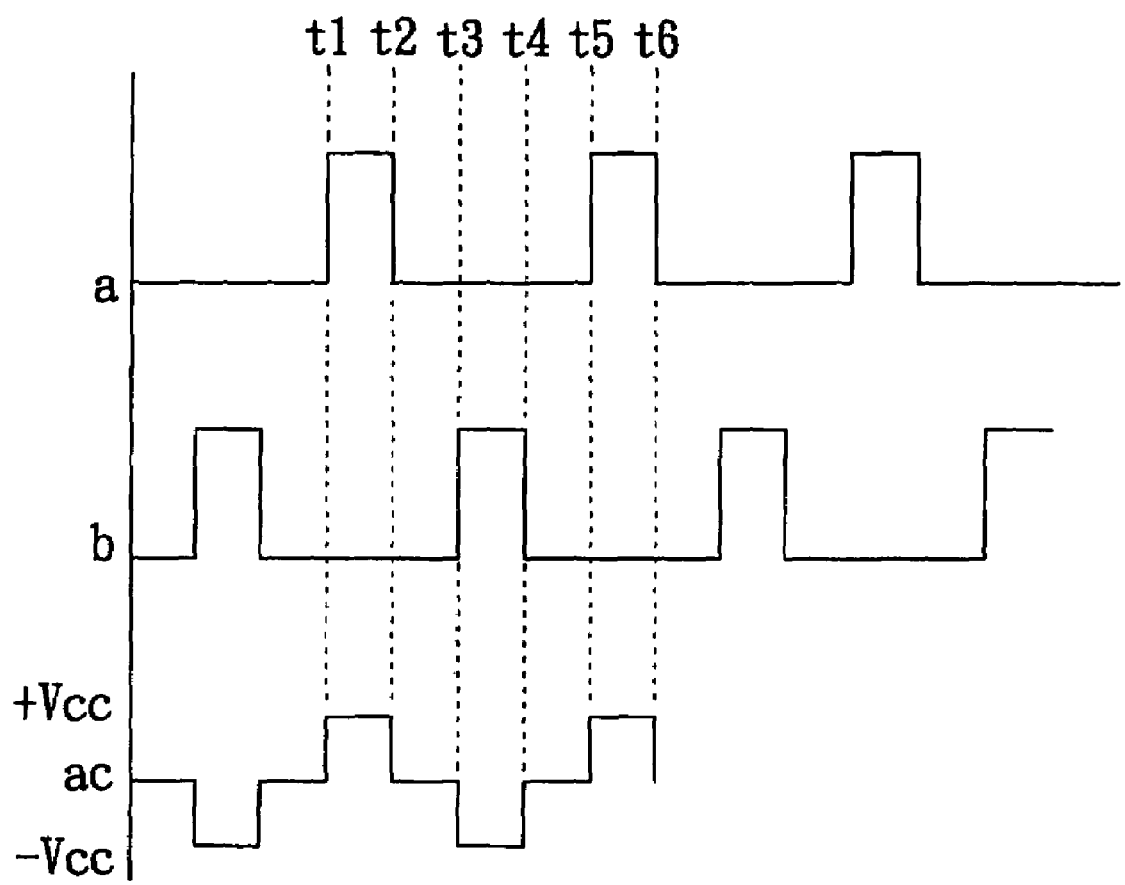
FIG. 6 is a waveform diagram of the output signals of the push/pull control chip and the AC power voltage of the present invention.

Reference is made to FIG. 6 as well as FIG. 5. The push/pull control chip 103 can be an LX1686, an LX1688 or an LX1691 push/pull control chip produced by Linfinity (Microsemi) Corporation, or an 02-9RR, an 0Z9930, an 0Z9938 or an 0Z9939 push/pull control chip produced by O2 Micro International Limited, or a TL-494 or a TL594 push/pull control chip produced by TEXAS INSTRUMENTS, or a BIT3193, a BIT3713, a BIT3715 or a BIT3501 push/pull control chip produced by Beyond Innovation Technology. Because there are so many brands in the market, only those in common use are listed above.

As shown in FIG. 6, the output terminal A of the push/pull control chip 103 outputs the first control signal a, and the output terminal B of the push/pull control chip 103 outputs the second control signal b. A voltage waveform ac of the AC power can be obtained on the first side of the transformer Tx.

Reference is made to FIG. 6 as well as FIG. 5 again. During a time $t_1$ to $t_2$, the first control signal a is at the high level, while the second control signal b is at the low level. The first control signal a turns on the output terminal of a first light-coupled switch U1, while the control power VDD is transmitted to the base of a first NPN transformer Q3 via the diode D1 so as to turn on the first NPN transformer Q3. Moreover, the control power VDD further turns on the first N-MOS Q1 via the diode D1 and the conducted first NPN transformer Q3. At a same time, the voltage on the first capacitor C1 is transmitted between the gate and the source of a first N-MOS Q1 to keep the first N-MOS Q1 on.

Moreover, the second control signal b turns off the output terminal of a second light-coupled switch U2, while the control power VDD is transmitted to the base of a second NPN transformer Q6 via the second resistor R2 and the fourth resistor R4 so as to turn on the second NPN transformer Q6. Furthermore, the second NPN transformer Q6 that is turned on couples to the gate of a second N-MOS Q2 to the reference terminal G to keep the second N-MOS Q2 off.

Therefore, at the time $t_1$ to $t_2$, the first N-MOS Q1 is on, and the second N-MOS Q2 is off. The DC power Vcc can transmit energy to the first side of the transformer Tx and the resonance capacitor CX in response to the conducted first N-MOS Q1. The voltage waveform ac obtained on the first side of the transformer Tx is a positive DC power +Vcc, and forms a positive half cycle of driving. At this time, a DC voltage will be built across two ends of the resonance capacitor CX.

Reference is made to FIG. 6 as well as FIG. 5 again. At a time $t_2$ to $t_3$, the first control signal a drops from the high level to the low level, and the second control signal b is maintained at the low level. At this time, the first control signal a turns off the output terminal of a first light-coupled switch U1 so as to cut off the control power VDD transmitted to the base of a first NPN transformer Q3 for turning off the first NPN transformer Q3. Moreover, the first PNP transformer Q4 that is turned on drives the first N-MOS Q1 to enter an off state. Because the second control signal b is maintained at the low level, the second N-MOS Q2 is off.

In the above descriptions, at the time $t_2$ to $t_3$, both the first N-MOS Q1 and the second N-MOS Q2 are off. At this time, the first side of the transformer Tx and a body diode DQ2 of the second N-MOS Q2 forms a continuous current loop so as to provide the flow path for the current in the first side of the transformer Tx. Moreover, the voltage waveform ac obtained on the first side of the transformer Tx is at a zero potential.

Reference is made to FIG. 6 as well as FIG. 5 again. At a time $t_3$ to $t_4$, the first control signal a is maintained at the low level, while the second control signal b rises from the low level to the high level. The second control signal b turns on the output terminal of a second light-coupled switch U2 so as to couple the base of a second PNP transformer Q5 to the reference terminal G, while the control power VDD is transmitted to the emitter of a second PNP transformer Q5, which lets the second PNP transformer Q5 enter the on state.

At this time, the first N-MOS Q1 is off, while the second N-MOS Q2 is on. The DC voltage built across the two ends of the resonance capacitor CX will be transmitted to the first side of the transformer Tx via the second N-MOS Q2 that is turned on. At this time, the voltage waveform ac obtained on the first side of the transformer Tx is a negative DC power −Vcc, and forms a negative half cycle of driving.

Reference is made to FIG. 6 as well as FIG. 5 again. At a time $t_4$ to $t_5$, the first control signal a is maintained at the low level, and the second control signal b drops from the high level to the low level. At this time, both the first N-MOS Q1 and the second N-MOS Q2 are off. At this time, the first side of the transformer Tx and a body diode DQ1 of the first N-MOS Q1 forms a continuous current loop so as to provide the flow path for the current in the first side of the transformer Tx. Moreover, the voltage waveform ac obtained on the first side of the transformer Tx is at a zero potential.

Reference is made to FIG. 6 as well as FIG. 5 again. In the present invention, the circuit actions of the half bridge driver and the voltage waveform ac obtained on the first side of the transformer Tx at a time $t_5$ to $t_6$ repeat those at the time $t_1$ to $t_2$. In this way, an AC power for providing energy is formed. At the same time, the transformer Tx boosts the AC power and then provides energy for the load RL from the second side.

To sum up, the half bridge driver of the present invention can connect the driver 30 to the conventional half bridge driver circuit to match the push/pull control chip 103 for control, hence having higher flexibility in practical use and not being limited by the control chip. Moreover, manufacturers only need to use the push/pull control chip 103 to drive and control a push/pull driver circuit or a half bridge driver circuit.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A half bridge driver connected to a first side of a transformer and a DC power, the half bridge driver comprising:
   a first light-coupled switch for receiving a first control signal;
   a first NPN transformer having a collector coupled to the first terminal of the first light-coupled switch and a base coupled to the second terminal of the first light-coupled switch;
   a first PNP transformer having a base and an emitter coupled to the base and the emitter of the first NPN transformer respectively, and a collector coupled to the first side of the transformer;
   a first resistor coupled between the base and the collector of the first PNP transformer;
   a first capacitor coupled between the collector of the first NPN transformer and the collector of the first PNP transformer;
   a diode having a cathode coupled to the collector of the first NPN transformer and an anode coupled to a control power;
   a second light-coupled switch for receiving a second control signal, and having a first output terminal coupled to the control power via a second resistor and a second output terminal coupled to a reference terminal;
   a second PNP transformer having an emitter coupled to the control power and a base coupled to the first output terminal of the second light-coupled switch via a third resistor;
   a second NPN transformer having a base coupled to the first output terminal of the second light-coupled switch via a fourth resistor and the reference terminal via a fifth resistor, and an emitter coupled to the reference terminal and a collector coupled to the collector of the second PNP transformer;
   a first N-MOS having a gate coupled to the emitter of the first PNP transformer and a drain coupled to the DC power and a source coupled to the first side of the transformer; and
   a second N-MOS having a gate coupled to the collector of the second PNP transformer and a drain coupled to the source of the first N-MOS and a source coupled to the reference terminal.

2. The half bridge driver as claimed in claim 1, wherein the DC power provides a positive DC power through conduction of the first N-MOS for the transformer to form a positive half-cycle of driving.

3. The half bridge driver as claimed in claim 1 further comprising a resonance capacitor, wherein the resonance capacitor couples in serial to the first side of the transformer.

4. The half bridge driver as claimed in claim 3, wherein the resonance capacitor provides a negative DC power through conduction of the second N-MOS for the transformer to form a negative half-cycle of driving.

5. The half bridge driver as claimed in claim 1 further comprising a push/pull control chip, wherein the push/pull control chip outputs the first control signal with a duty cycle greater than 50% and the second control signal with a duty cycle smaller than 50%.

6. The half bridge driver as claimed in claim 1 further comprising a first zener diode coupled between the gate and the source of the first N-MOS.

7. The half bridge driver as claimed in claim 1 further comprising a second zener diode coupled between the gate and the source of the second N-MOS.

* * * * *